United States Patent
Wu et al.

(10) Patent No.: US 6,853,594 B1
(45) Date of Patent: Feb. 8, 2005

(54) DOUBLE DATA RATE (DDR) DATA STROBE RECEIVER

(75) Inventors: Chung-Hsiao R. Wu, Sunnyvale, CA (US); Jyh-Ming Jong, Saratoga, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 29 days.

(21) Appl. No.: 10/625,298

(22) Filed: Jul. 22, 2003

(51) Int. Cl.⁷ ................................................ G11C 7/00
(52) U.S. Cl. ................... 365/193; 365/194; 365/189.07
(58) Field of Search ................. 365/193, 194, 365/189.07, 195, 154, 205, 206, 233

(56) References Cited

U.S. PATENT DOCUMENTS

| | | | |
|---|---|---|---|
| 5,881,007 A | * | 3/1999 | Jeong et al. ............... 365/207 |
| 6,233,180 B1 | * | 5/2001 | Eitan et al. ................ 365/196 |
| 6,512,704 B1 | | 1/2003 | Wu et al. ............... 365/189.07 |
| 2003/0210575 A1 | * | 11/2003 | Seo et al. ............. 365/189.05 |

* cited by examiner

*Primary Examiner*—Richard Elms
*Assistant Examiner*—Dang Nguyen
(74) *Attorney, Agent, or Firm*—Park, Vaughan & Fleming LLP

(57) ABSTRACT

A data strobe receiver that includes a first comparator. The first comparator has a first input that is coupled to a first reference voltage. The first comparator has a second input that is coupled to a data strobe. The first comparator also has an output. The data strobe receiver also includes a delay element. The delay element has an input that is coupled to the output of the first comparator. The delay element also has an enable input and an output. The data strobe receiver also includes a second comparator. The second comparator has a first input that is coupled to a second voltage reference. The second comparator has a second input that is coupled to the data strobe. The second comparator also has an output. The data strobe receiver also includes a divide-by-X-counter, where X is an integer greater than 1 and less than 129. The divide-by-X-counter has an input that is coupled to the output of the second comparator.

22 Claims, 5 Drawing Sheets

DOUBLE DATA RATE (DDR) DATA STROBE RECEIVER

Field of the Invention

The present invention generally relates to semiconductor devices. More specifically, the present invention relates to data strobe receivers.

BACKGROUND

There has increasingly been a demand for faster, higher capacity random access memory (RAM) devices. At one time, dynamic random access memory (DRAM) was typically used as the main memory in computer systems. Although the operating speed of DRAM improved over the years, this speed did not reach the operating speed of the processors used to access the DRAM. In a computer system, for example, the slow access and cycle times of the DRAM led to system bottlenecks. These bottlenecks slowed down the throughput of the system despite the very fast operating speed of the computer system's processor.

As a result, a new type of memory known as synchronous dynamic random access memory (SDRAM) was developed to provide faster operation in a synchronous manner. SDRAMs are designed to operate synchronously with the computer system's clock. That is, the input and output data of the SDRAM are synchronized to an active edge of the computer system's clock.

Although SDRAMs have overcome some of the timing disadvantages of other memory devices, such as DRAMs, there is still a need for faster memory devices. Double data rate (DDR) SDRAMs provide twice the operating speed of conventional SDRAMs. These devices allow data transfers on both the rising and falling edges of the computer system's clock and thus provide twice as much data as the conventional SDRAM. DDR SDRAMs are also capable of providing burst data at a high-speed data rate.

Due to the high-speed data transfers, DDR SDRAMs use a bi-directional data strobe (DQS) to register the data being input or output on both edges of the computer system's clock. Industry standards define several states of DQS before, during, and after a burst transfer of data. Before a burst transfer of data, DQS is in a high-impedance state that is known as Hi-Z. When DQS is in Hi-Z, DQS is at a voltage level between logic high and logic low.

One clock cycle before a burst data transfer, DQS transitions from Hi-Z to logic low. This logic low state is known as "data strobe preamble." After the data strobe preamble, DQS transitions (both low-to-high transitions and high-to-low transitions) are utilized to synchronize the transferred data. One half clock before the data transfer is completed, DQS remains in a logic low state. This state is known as "postamble." After the completion of the postamble, DQS enters the Hi-Z state.

Thus, a need exists for a simple DQS receiver that can accurately determine DQS transitions and can avoid false determinations due to electrical noise.

SUMMARY OF THE INVENTION

One embodiment of the invention is a data strobe receiver that includes a first comparator. The first comparator has a first input that is coupled to a first reference voltage. The first comparator has a second input that is coupled to a data strobe. The first comparator also has an output. The data strobe receiver also includes a delay element. The delay element has an input that is coupled to the output of the first comparator. The delay element also has an enable input and an output. The data strobe receiver also includes a second comparator. The second comparator has a first input that is coupled to a second voltage reference. The second comparator has a second input that is coupled to the data strobe. The second comparator also has an output. The data strobe receiver also includes a divide-by-X-counter, where X is an integer greater than 1 and less than 129 (such as 2, 4, 8, 16, 32, 64, or 128). The divide-by-X-counter has an input that is coupled to the output of the second comparator.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Data Strobe Receiver

Figure 1:
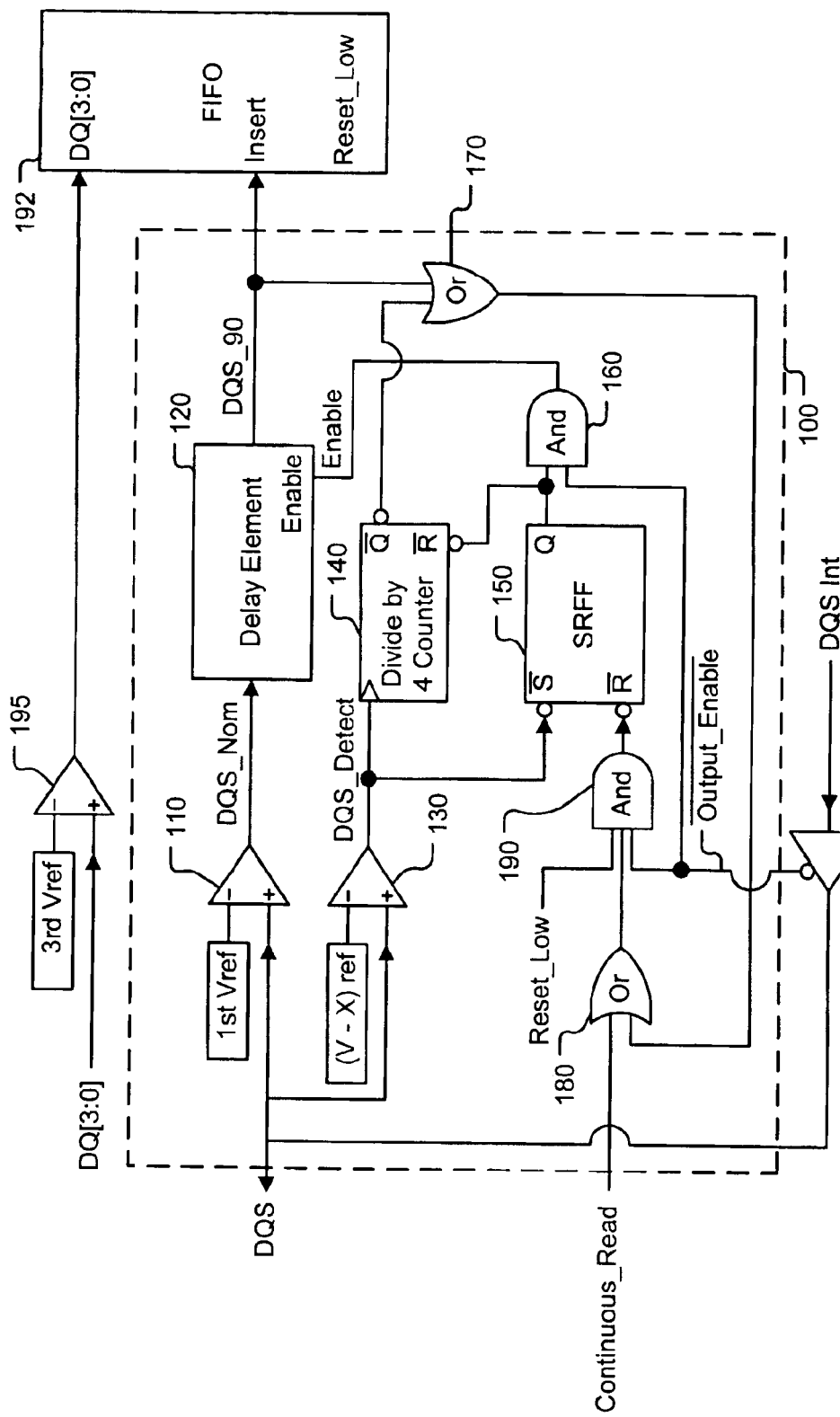
FIG. 1 presents a data strobe (DQS) receiver.

FIG. 1 presents a data strobe (DQS) receiver 100 that accurately determines DQS transitions.

As shown in FIG. 1, the DQS receiver 100 includes a first comparator 110. The first comparator 110 contains two inputs and an output. The first input of the first comparator 110 is coupled to a first voltage reference. For example, the first input of the first comparator 110 could be coupled to a 1.25 volt or a 0.9 volt reference. The second input of the first comparator 110 is coupled to DQS. The output of the first comparator 110 will be referred to as DQS_Nom.

As shown in FIG. 1, the DQS receiver 100 also includes a delay element 120. The delay element 120 includes a signal input, an enable input, and a signal output. The signal input of the delay element 120 is coupled to the output of the first comparator 110. In some embodiments of the invention, the delay element 120 is operable to delay the output of the first comparator 110 by approximately 90 degrees. In other embodiments of the invention, the delay element 120 is operable to delay the output of the first comparator 110 by more than 45 degrees, less than 135 degrees, or between 45 degrees and 135 degrees. In still other embodiments of the invention, the delay of the delay element 120 is programmable during or after assembly of the DQS receiver 100. The signal output of the delay element 120 will be referred to as DQS_90. When the enable input of the delay element 120 is active, the delay element 120 outputs a delayed signal. However, when the enable input of the delay element 120 is inactive, no signal is output by the delay element 120.

Referring again to FIG. 1, the DQS receiver 100 also includes a second comparator 130. The second comparator 130 includes two inputs and an output. The first input of the second comparator 130 is coupled to a second voltage reference (V-X) ref. The voltage potential of the second voltage reference is typically not equal to the voltage potential of the first voltage reference. In some embodiments of the invention, the voltage potential of the second voltage reference is programmable during or after assembly of the DQS receiver 100. The voltage potential of the second voltage reference can be selected based upon the amount of electrical noise rejection required for a particular application. The second input of the second comparator 130 is coupled to DQS. The output of the second comparator 130 will be referred to as DQS_Detect.

Figure 3:
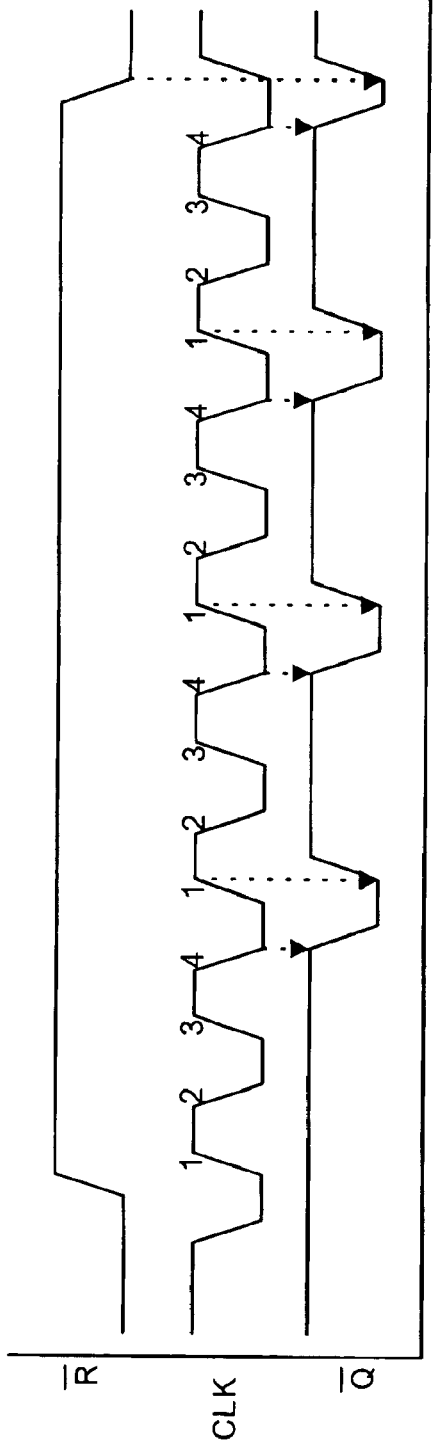
FIG. 3 presents a timing diagram of a divide-by-4 counter.
Figure 4:
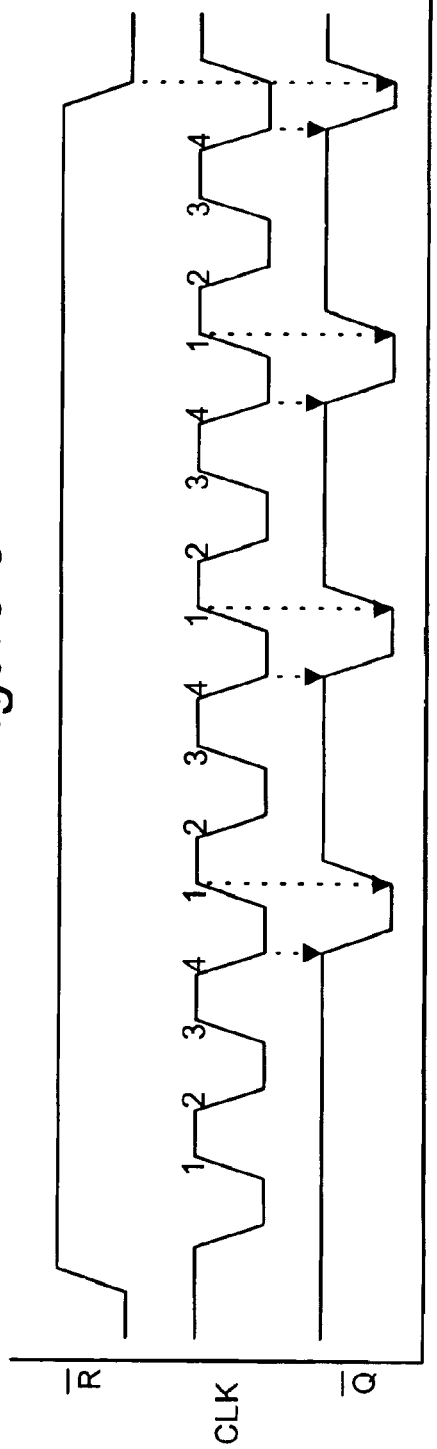
FIG. 4 presents another timing diagram of a divide-by-4 counter.

The DQS receiver 100 also includes a divide-by-4-counter 140. The divide-by-4-counter 140 contains a clock input, an inverted reset input and an inverted output. The clock input to the divide-by-4-counter 140 is coupled to DQS_Detect. As shown in FIG. 3, in some embodiments of the invention, the inverted output of the divide-by-4-counter 140 is low when the counter has detected four logic state transitions. As shown in FIG. 4, in some embodiments of the invention, the divide-by-4-counter 140 always starts to count with the rising edge of the clock input. Thus, such divide-by-4 counters will ignore the first falling edge of the clock after the inverted reset transitions to a high logic state. In other embodiments of the invention, the DQS receiver 100 includes a divide-by-8-counter or even a divide-by-16-counter. Still other embodiments of the invention utilize a divide-by-X-counter, where X is an integer greater than 1 and less than 129. In still other embodiments, the value of X is programmable during or after assembly of the DQS receiver 100.

Figure 2:
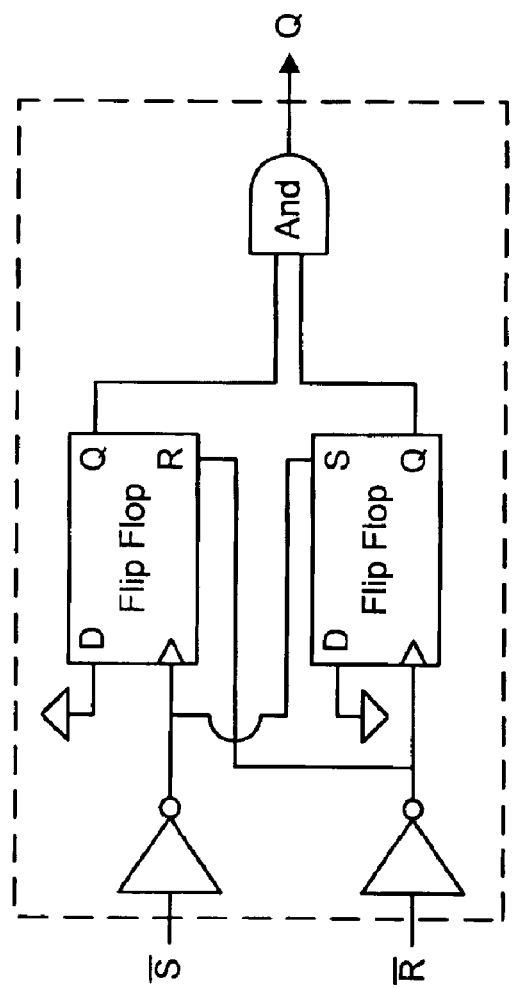
FIG. 2 presents a set-reset-flip-flop.

The DQS receiver 100 also includes a set-reset-flip-flop 150. The set-reset-flip-flop 150 contains an inverted set input, an inverted reset input, and an output. Set-reset-flip-flops are known to those of skill in the art and can be constructed by many different combinations of logic gates. One embodiment of the invention utilizes the combination of logic gates such as shown in FIG. 2 to create the set-reset-flip-flop 150. As shown in FIG. 1, the inverted set input of set-reset-flip-flop 150 is coupled to DQS_Detect. The output of set-reset-flip-flop 150 is coupled to the inverted reset input of the divide-by-4-counter 140.

The DQS receiver 100 also includes a first AND gate 160. The first AND gate 160 contains two inputs and one output. The first input of the first AND gate 160 is coupled to the output of the set-reset-flip-flop 150 (and the inverted input of the divide-by-4-counter 140). The second input of the AND gate 160 is coupled to an inverted Output_Enable signal. The inverted Output_Enable signal is high when the memory controller is reading memory and is low when the memory controller is writing to memory. The output of the first AND gate 160 is coupled to the enable input of the delay element 120.

The DQS receiver 100 also includes a first OR gate 170. The first OR gate 170 contains two inputs and one output. The first input of the first OR gate 170 is coupled to the inverted output of the divide-by-4-counter 140. The second input of the first OR gate 170 is coupled to DQS_90.

Figure 5:
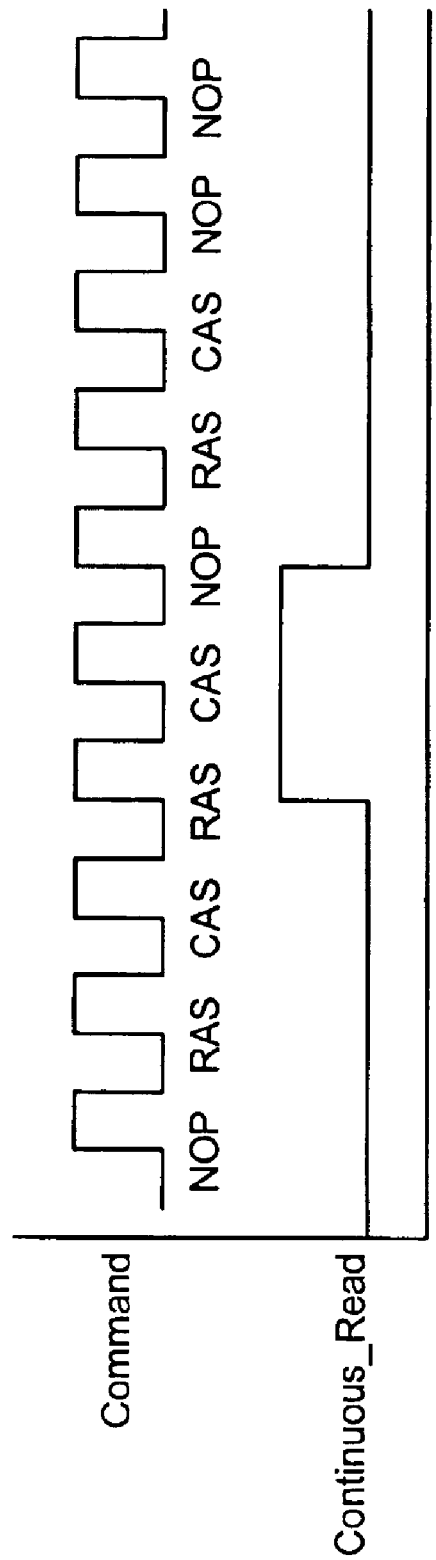
FIG. 5 presents a timing diagram of Row Address Strobe ("RAS"), Column Address Strobe ("CAS") and Continuous_Read signals.

The DQS receiver 100 also includes a second OR gate 180. The second OR gate 180 contains two inputs and an output. The first input of the second OR gate 180 is coupled to a Continuous_Read signal. As shown in FIG. 5, the Continuous_Read signal is typically set to logic high when a memory controller is continuously reading memory. In some embodiments of the invention, the Continuous_Read signal is active for (N−1)*2 clock cycles, where N is the number of consecutive reads. The second input of the second OR gate 180 is coupled to the output of the first OR gate 170.

The DQS receiver 100 also contains a second AND gate 190. The second AND gate 190 contains three inputs and an output. The first input of the second AND gate 190 is coupled to a Reset_Low signal. The Reset_Low signal, which is active when low, resets the DQS receiver 100. The second input of the second AND gate 190 is coupled to the output of the second OR gate 180. The third input of the second AND gate 190 is coupled to the inverted Output_Enable signal. The output of the second AND gate 190 is coupled to the inverted reset input of the set-reset-flip-flop 150.

The DQS receiver 100 is coupled to a first-in-first-out buffer (FIFO) 192. The FIFO 192 contains a data input, which will be referred to as DQ, an insert input, and a Reset_Low input. The data input is coupled to the output of a third comparator 195, which has two inputs. One input of the third comparator 195 is coupled to a third voltage reference and the second input of the third comparator 195 is coupled to a DQ input. As is shown in FIG. 1, the insert input of the FIFO is coupled to the output of the DQS receiver 100.

A Method of Operating a Data Strobe Receiver

Figure 6:
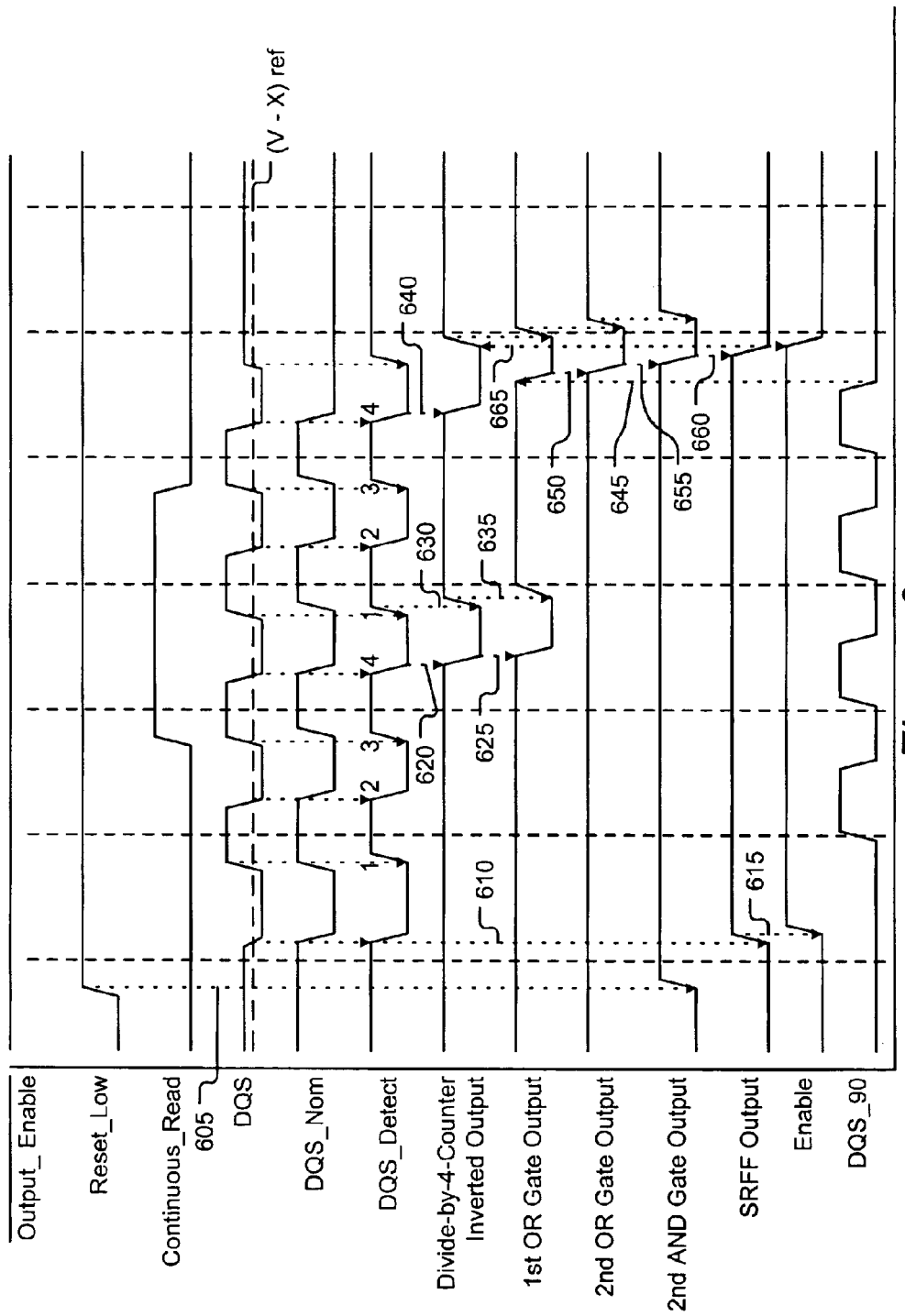
FIG. 6 presents a timing diagram of signals within a data strobe receiver.

One method of operating the DQS receiver 100 is shown in FIG. 6.

Referring to FIG. 6, the inverted Output_Enable is high. Thus, the memory controller is operating in a read mode. Initially, the Reset_Low signal is low indicating that the DQS receiver 100 is in its reset mode of operation. At time 605, Reset_Low transitions to a high logic state. This causes the output of the second AND gate 190 to transition to a high logic state, which causes the set-reset-flip-flop 150 to exit its reset mode.

At time 610, the DQS signal falls below (V-X) ref. Thus, the output of the second comparator 130, DQS_Detect, begins to enter a low logic state. Thus, the output of the set-reset-flip-flop 150 enters a logic high state at time 615, the divide-by-4-counter 140 is released from its reset mode, and the delay element 120 is enabled. As a result, the divide-by-4-counter 140 begins counted transitions of DQS_Detect, and the Delay Element 120 begins outputting DQS_90.

At time 620, the divide-by-4-counter 140 has counted four state transitions of DQS_Detect. Thus, the inverted output of the divide-by-4-counter 140 begins to enter a logic low state. As a result, at time 625, the output of the first OR gate 170 begins to transition to a low logic state. Even though the output of the first OR gate 170 is low at this time, the Continuous_Read signal is high. Thus, the output of the second OR gate 180, remains high.

At time 630, the divide-by-4-counter 140 has detected anther transition of DQS_Detect. Thus, its inverted output begins to transition to a high logic state. This transition causes the output of the first OR gate to begin to transition to a high logic state at time 635.

At time 640, the divide-by-4-counter 140 has counted another four state transitions of DQS_Detect. Thus, the inverted output of the divide-by-4-counter 140 begins to enter a logic low state. However, the output of the first OR gate 170 remains high until DQS_90 transitions to a low logic state at time 645. At that time, the output of the first OR gate 170 begins to transition to a low logic state. Because at time 650, the Continuous_Read signal is low, the output of the second OR gate 180 begins to transition to a low logic state. When the output of the second OR gate 180 reaches its low logic state at time 655, the output of the second AND gate begins to transition to a low logic state. When the output of the second AND gate reaches its low logic state at time 660, the set-reset-flip-flop 150 is reset, thereby causing the output of the set-reset-flip-flop 150 to begin to transition to a low logic state.

When the set-reset-flip-flop 150 enters its low logic state at time 665, the delay element 120 is disabled and the divide-by-4-counter is reset. Thus, DQS_90 is held at a low logic state regardless of the logic state of DQS.

CONCLUSION

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

It is claimed:

1. A data strobe receiver comprising:
   a) a first comparator, the first comparator having a first input that is coupled to a first reference voltage, the first comparator having a second input that is coupled to a data strobe, the first comparator having an output;
   b) a delay element, the delay element having an input that is coupled to the output of the first comparator;
   c) a second comparator, the second comparator having a first input that is coupled to a second voltage reference, the second comparator having a second input that is coupled to the data strobe, the second comparator having an output; and
   d) a divide-by-X-counter, where X is an integer greater than 1 and less than 129, the divide-by-X-counter having an input that is coupled to the output of the second comparator.

2. The data strobe receiver of claim 1, wherein the delay element includes an enable input.

3. The data strobe receiver of claim 1, wherein the delay element delays the output of the first comparator by more than 45 degrees.

4. The data strobe receiver of claim 1, wherein the delay element delays the output of the first comparator by less than 135 degrees.

5. The data strobe receiver of claim 1, wherein the delay element delays the output of the first comparator by more than 45 degrees and less than 135 degrees.

6. The data strobe receiver of claim 1, wherein the delay of the delay element is programmable.

7. The data strobe receiver of claim 1, wherein the value of X is programmable.

8. The data strobe receiver of claim 1, wherein a divide-by-X-counter has an inverted reset input.

9. The data strobe receiver of claim 1, wherein the divide-by-X-counter includes an inverted output.

10. The data strobe receiver of claim 1, wherein the divide-by-X-counter is a divide-by-4-counter.

11. The data strobe receiver of claim 1, further comprising:
   e) a set-reset-flip-flop, the set-reset-flip-flop having an input that is coupled to the output of the second comparator.

12. The data strobe receiver of claim 11, wherein the input that is coupled to the output of the second comparator is an inverted set input.

13. The data strobe receiver of claim 11, wherein the set-reset-flip-flop contains an output that is coupled to the input of a first AND gate.

14. The data strobe receiver of claim 11, wherein the data strobe receiver contains a first AND gate, the set-reset-flip-flop contains an output that is coupled to the first input of the first AND gate, and the divide-by-X-counter contains an inverted reset input that is coupled to the first input of the first AND gate.

15. The data strobe receiver of claim 11, wherein the data strobe receiver contains a first OR gate, the first OR gate having a first input and a second input, the first input of the first OR gate is coupled to the inverted output of the divide-by-X-counter, and the second input of the first OR gate is coupled to the output of the delay element.

16. The data strobe receiver of claim 15, wherein the data strobe receiver contains a second OR gate having a first input and a second input, the first input of the second OR gate is coupled to a continuous read signal, and the second input of the second OR gate is coupled to the output of the first OR gate.

17. The data strobe receiver of claim 16, wherein the set-reset-flip-flop includes an inverted reset input.

18. The data strobe receiver of claim 16, wherein the set-reset-flip-flop includes an inverted reset input, and the second OR gate includes an output that is coupled to the inverted reset input of the set-reset-flip-flop via a second AND gate.

19. The data strobe receiver of claim 18, wherein the second AND gate contains a first input and a second input, the first input of the second AND gate is coupled to a reset signal and the second input of the second AND gate is coupled to the output of the second OR gate.

20. The data strobe receiver of claim 18, wherein the second AND gate contains a first input and a second input, the first input of the second AND gate is coupled to an inverted output enable signal and the second input of the second AND gate is coupled to the output of the second OR gate.

21. The data strobe receiver of claim 18, wherein the second AND gate contains a first input, a second input, and a third input, the first input of the second AND gate is coupled to a reset signal, the second input of the second AND gate is coupled to the output of the second OR gate, and the third input of the second AND gate is coupled to an inverted output enable signal.

22. The data strobe receiver of claim 1, wherein the output of the delay element is coupled to an insert input of a first-in-first-out buffer.

* * * * *